US009122168B2

(12) United States Patent
Panda

(10) Patent No.: US 9,122,168 B2
(45) Date of Patent: Sep. 1, 2015

(54) LITHOGRAPHY METHOD AND DEVICE

(71) Applicant: Micron Technology, Inc., Boise, ID (US)

(72) Inventor: Durga Prasanna Panda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/275,600

(22) Filed: May 12, 2014

(65) Prior Publication Data

US 2014/0246756 A1 Sep. 4, 2014

Related U.S. Application Data

(62) Division of application No. 13/192,117, filed on Jul. 27, 2011, now Pat. No. 8,722,320.

(51) Int. Cl.

| | |
|---|---|
| ***G03F 1/48*** | (2012.01) |
| ***H01L 21/027*** | (2006.01) |
| ***H01L 21/033*** | (2006.01) |

(52) U.S. Cl.

CPC .............. *G03F 1/48* (2013.01); *H01L 21/0273* (2013.01); *H01L 21/0337* (2013.01); *H01L 21/0338* (2013.01)

(58) Field of Classification Search

CPC .............................. H01L 21/0338; G03F 1/48

See application file for complete search history.

(56) References Cited

U.S. PATENT DOCUMENTS

| | | | | |
|---|---|---|---|---|
| 7,687,408 | B2 | 3/2010 | Abatchev et al. | |
| 7,811,940 | B2 | 10/2010 | Sandhu | |
| 7,855,148 | B2 | 12/2010 | Olson | |
| 8,722,320 | B2 | 5/2014 | Panda | |
| 2005/0250021 | A1* | 11/2005 | Chen et al. | 430/5 |
| 2006/0088987 | A1* | 4/2006 | Yeo et al. | 438/488 |
| 2007/0161251 | A1 | 7/2007 | Tran et al. | |
| 2009/0170035 | A1 | 7/2009 | Lee et al. | |
| 2010/0055621 | A1 | 3/2010 | Hatakeyama et al. | |
| 2010/0248491 | A1* | 9/2010 | Sun et al. | 438/717 |
| 2013/0026610 | A1 | 1/2013 | Panda | |

* cited by examiner

*Primary Examiner* — Brittany Raymond

(74) *Attorney, Agent, or Firm* — Schwegman Lundberg & Woessner, P.A.

(57) ABSTRACT

Lithography methods and devices are shown that include a semiconductor structure such as a mask. Methods and devices are shown that include a pattern of mask features and a composite feature. Selected mask features include doubled mask features. Methods and devices shown may provide varied feature sizes (including sub-resolution) with a small number of processing steps.

18 Claims, 4 Drawing Sheets

LITHOGRAPHY METHOD AND DEVICE

PRIORITY APPLICATION

This application is a divisional of U.S. application Ser. No. 13/192,117, filed Jul. 27, 2011, which is incorporated herein by reference in its entirety.

TECHNICAL FIELD

Various embodiments described herein relate to apparatus, systems, and methods associated with lithography, for example patterning and printing features in the manufacture of semiconductor components.

BACKGROUND

Photolithography is a fabrication technique that is employed for use in a number of industries, including the semiconductor processing industry. Specifically, photolithography uses an energy source such as ultraviolet (UV) light, x-ray wavelength, other wavelengths of radiation, etc. to expose selected regions of a surface. In one common technique, the surface includes a semiconductor wafer such as silicon that has been coated with a resist material. The resist material properties are locally changed when exposed to the energy source, which allows selected regions of the resist material to remain, while unwanted regions of the resist material are removed.

In one method of photolithography, a pattern of features is created on a reticle or mask, and the pattern on the reticle is focused onto a semiconductor surface using optics that adjust the scale of the pattern on the reticle to fit the semiconductor surface. In the semiconductor industry, there is an ever present pressure to reduce the size of features in the pattern to increase the density of patterned features packed into the same semiconductor surface area. In one example industry, manufacturers of random access memory chips such as dynamic random access memory (DRAM) strive to put more storage cells onto a single chip.

As feature size decreases, photolithography of smaller and smaller features becomes more and more difficult. Methods and devices are needed that provide smaller features and improve process efficiency.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, optical, material changes, etc. may be made.

The term "horizontal" as used in this application is defined as a plane parallel to the conventional plane or surface of a substrate, such as a wafer or die, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

Figure 1:
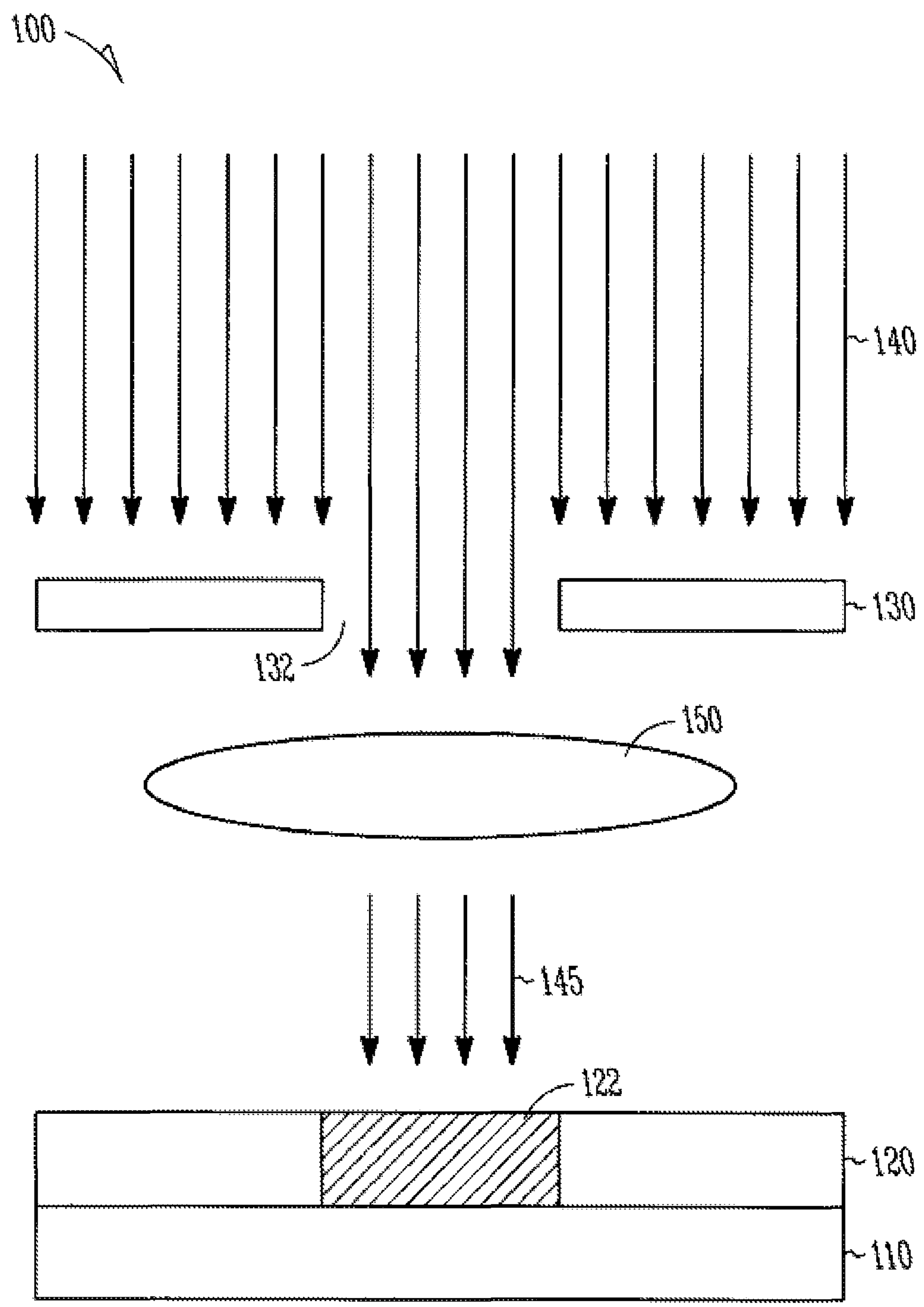
FIG. 1 shows a lithography system according to an embodiment of the invention.

FIG. 1 shows a system where a pattern of features is formed on a reticle and the pattern is then transferred to a substrate by means of photolithography. In one embodiment the pattern of features includes semiconductor device component features, including, but not limited to, source/drain regions, transistor gates, trace lines, source/drain contacts, vias, capacitor plates, etc. FIG. 1 shows a photolithography system 100 according to an embodiment of the invention. The system 100 includes a substrate 110. In one embodiment, the substrate 110 includes a semiconductor substrate, such as a silicon wafer. Although a semiconductor substrate is discussed for illustration, embodiments of the invention will comprise other working surfaces utilizing photolithography.

A resist material 120 is located over a surface of the substrate 110. A reticle 130 is shown with an aperture 132, and is spaced apart from the resist material 120 by a focal length. The reticle 130 is shown in a simplified form with an energy blocking region and an aperture 132. In one embodiment, the reticle 130 further includes a material that is substantially transparent, such as a glass. In one embodiment, the reticle 130 further includes an attenuated and partly opaque portion adapted to block a portion of an energy source 140 or to phase shift a portion of the energy source 140. The terms "transparent", "attenuated", "partly opaque" and other associated optical terms in the present specification refer to optical properties of the reticle 130. Possible energy sources include, but are not limited to, UV radiation and x-ray radiation. One source of suitable energy is from a laser light source.

The energy source 140 is directed toward the resist material 120, with a portion of the energy source 140 being blocked by the reticle 130. A portion of the energy source 140 is shown passing through the aperture 132 in the reticle 130 and toward projection optics 150. Projection optics 150 may be utilized to focus and scale the energy source 140 that passes through the aperture 132. Projection optics 150 may comprise one lens or up to and more than 40 lens elements. Projection optics 150 may be used to scale the energy 140 to smaller features than is possible with reticle 130 alone, thus allowing focused energy source 145 to write smaller features onto the resist material 120. The focused energy source 145 is shown contacting the resist material 120 in a selected region 122. The selected region 122 interacts with the focused energy source 145 to selectively alter the resist material properties of resist material 120. Two possible interactions include a curing of the resist material and a weakening of the resist material. In one possibility, the resist material 120 in the selected region 122 is cured and remains while the non-selected region of the resist material 120 is removed. In another possibility, the resist material 120 in the selected region 122 is weakened and is removed while the non-selected region of the resist material remains.

New techniques in the semiconductor industry are constantly being developed to print smaller and smaller features, however, frequently very small features must be printed in a separate processing operation from larger features. Printing features of different sizes in more than one processing operation adds cost to fabrication, and the additional processing steps increase the possibility of additional manufacturing yield loss. Methods that reduce a number of processing operations are needed.

Figure 2A:
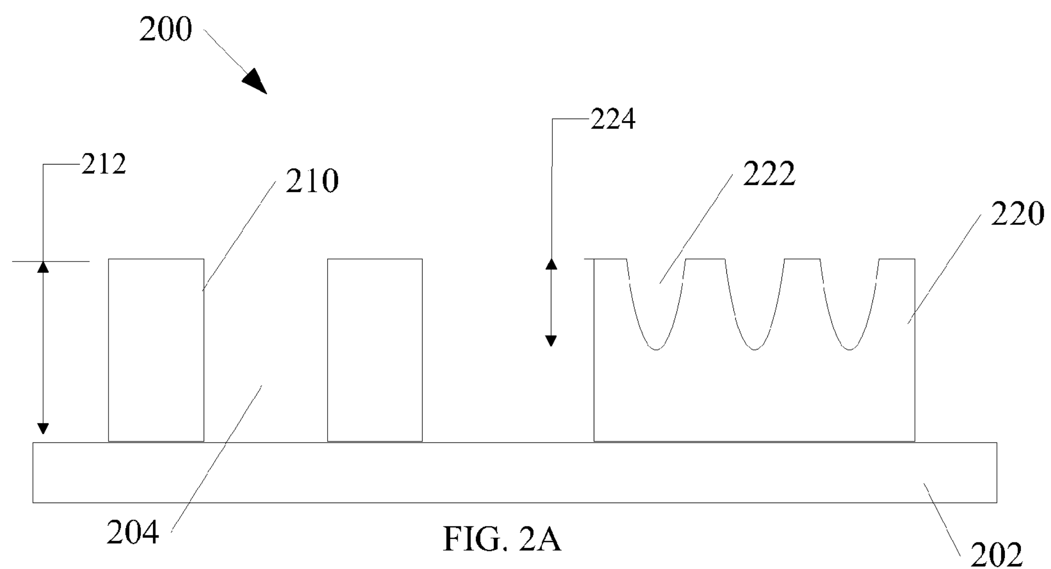
FIG. 2A-2G show processing operations to form a semiconductor structure according to an embodiment of the invention.

FIGS. 2A-2G show processing operations to form a semiconductor structure according to an embodiment of the invention. The Figures are shown in a simplified cross section, and are not necessarily to scale. FIG. 2A shows a number of mask features 200 on a substrate 202. In one example, the substrate 202 includes a semiconductor substrate, such as silicon, germanium, gallium arsenide, etc. In one example, the mask features 200 are formed using lithography from a first mask material of thickness 212. In one example the first mask material is a resist material.

The mask features 200 include a first feature 210 and a second feature 220. As shown in the Figure, in one example, both the first feature 210, and the second feature 220 have a thickness 212 measured from the substrate 202 to their highest point. A number of spaces 204 are shown where the first mask material has been removed (e.g. in a lithography operation).

FIG. 2A further shows a recess 222 in the second feature 220. In one example, as illustrated in FIG. 2A, a number of recesses 222 are included within the second feature 220. In one example, the recess 222 is formed during the same lithography process as the number of spaces 204. The recess 222 is formed to a depth 2224 through only a portion of the thickness 212 of the first mask material. In one example, a sub-resolution feature is used to form the recess 222. A sub-resolution feature may not allow enough of an energy source (e.g. energy source 140) through a reticle (e.g. reticle 130) to form a space all the way through the thickness 212 of the first mask material.

Figure 2B:
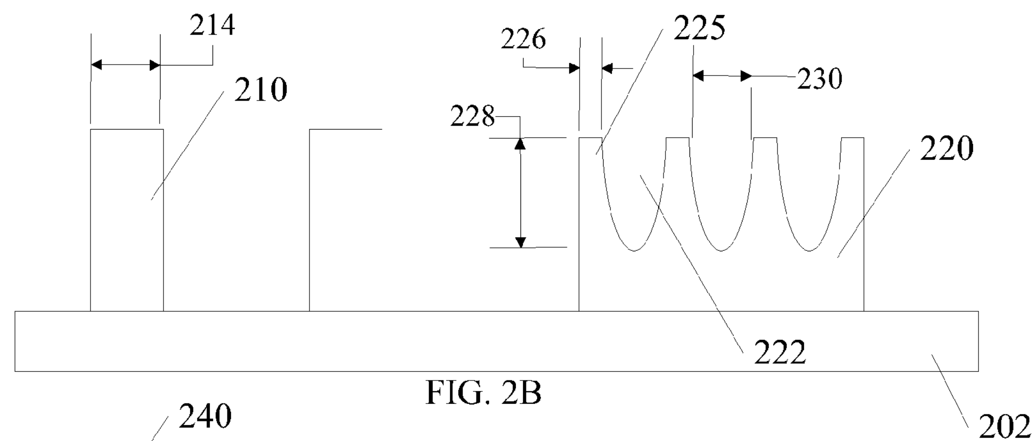

In one embodiment, the number of mask features 200 may be further processed in a trimming operation. FIG. 2B shows the number of mask features 200 after an example trimming operation. The first features 110 are reduced from their original width to a trimmed width 214. In one example, a trimming operation includes an etch, or other removal process that reduces width 214, yet leaves the number of mask features 200 in place. In addition to reducing width 214, a trimming operation may also sharpen corners of the number of mask features 200.

In embodiments using a trimming operation, the recesses 222 of the second feature 220 may be deepened from depth 224 to a depth 228 and widened to a width 230. A number of full thickness portions 225 may also be reduced to a width 226.

Figure 2C:
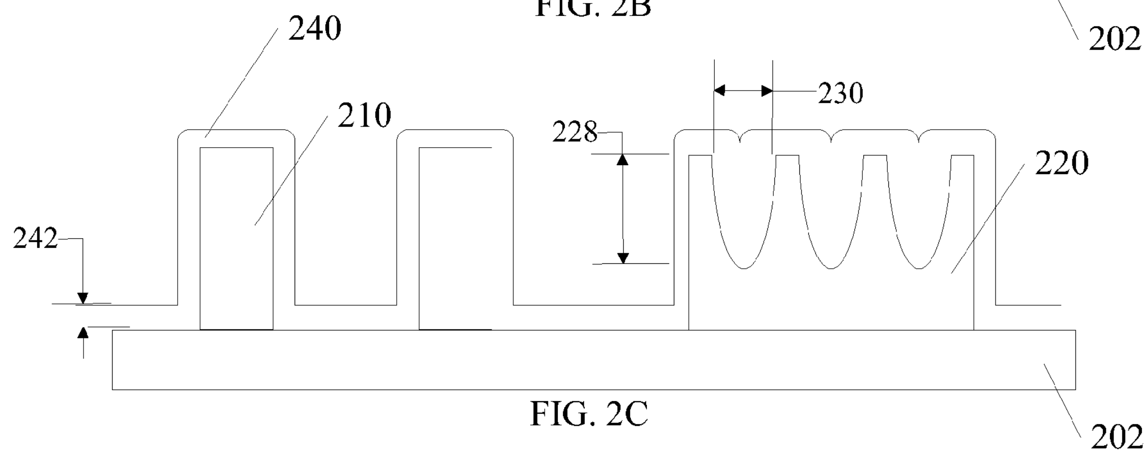

FIG. 2C shows the number of mask features 200 with a second mask material 240 deposited over the number of mask features 200. In one example, the second mask material 240 includes a hardmask material. One example of a hardmask material includes amorphous carbon or a low temperature dielectric (e.g. ALD Oxide). FIG. 2C shows the second mask material 240 deposited to a thickness 242. In one example, the thickness 242 is substantially consistent over the number of mask features 200 and the substrate 202.

FIG. 2C shows the recesses 222 filled with the second mask material 240. In one example, the width 230 of the recesses 222 is such that the second mask material 240 builds up within the recesses 222 to a thickness 228 that is greater than the thickness 242 of the second mask material 240 in other locations.

Figure 2D:
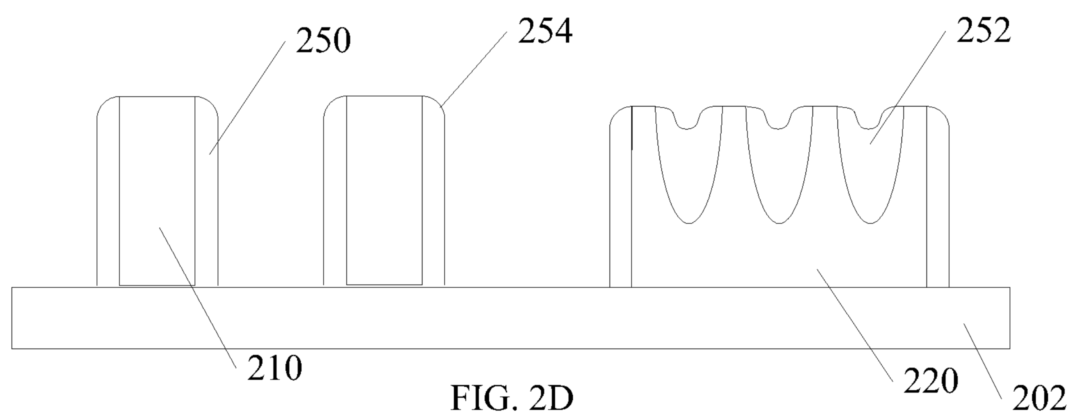

FIG. 2D shows the number of mask features 200 after a selective removal operation. A portion of the second mask material 240 has been removed, leaving behind sidewall portions 250 and protective portions 252 within the recesses 222. In one example, the selective removal operation includes an anisotropic removal operation that preferentially removes one portion of the second mask material 240 more quickly than other portions. For example, FIG. 2D illustrates an operation where horizontal portions of the second mask material 240 are removed, leaving vertical portions behind. In one example, the selective removal operation includes a directional etch operation. In one example the selective removal operation includes a plasma removal operation.

In one example, protective portions 252 remain, while other horizontal portions of the second mask material 240 are removed in part because of the increased thickness 228 within the recesses 222. In one example, corners 254 of remaining portions of the second mask material 240 may be rounded.

In FIG. 2D, the first feature 210 and the second feature 220 remain, with the sidewall portions 250 and protective portions 252 forming interfaces with various parts of the first feature 210 and the second feature 220. As recited above, the first feature 210 and the second feature 220 are formed from a first mask material, while the sidewall portions 250 and protective portions 252 are formed from a second mask material. In one example, the first mask material and the second mask material are selective to removal processes such that, for example, the first mask material is removable while leaving the second mask material substantially whole.

Figure 2E:
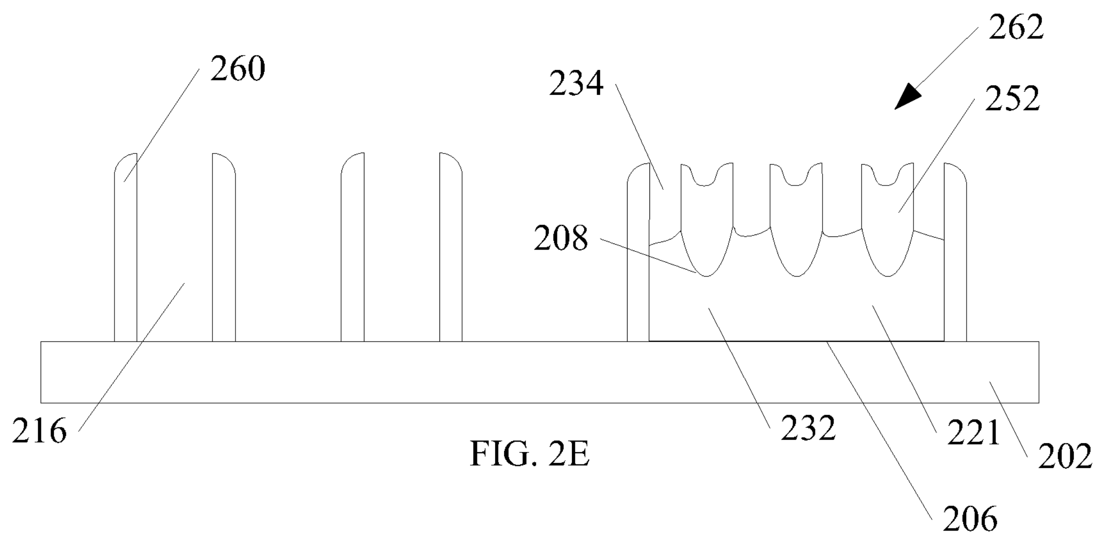

FIG. 2E shows the substrate 202 after a selective removal process of the first mask material. The sidewall portions 250 are left behind, forming a second pattern of mask features 260. In one example, the second pattern of mask features 260 form a doubled pattern, where two sidewalls of a single first feature 210 are used to form two second features 260. In addition to the economy of forming two features 260 for every single first feature 210, examples as described above may be used to form a second pattern of mask features 260 that are all much smaller than the first feature 210. A width of the second features 260 is dictated only by deposition thickness 242, not by limitations of energetic wavelength as in the lithography used to form the first feature 210.

FIG. 2E further shows a composite feature 262 formed by embodiments of the present disclosure. The composite feature 262 includes a first material portion 221 formed from the second feature 220. The first material portion 221 forms an interface with the substrate 202. The composite feature 262 also includes the protective portions 252 from the operation described in FIG. 2D. The protective portions 252 form an interface with the first material portion 221.

In one example, first material portion 221 is not removed during the first material removal operation due to the protective portions 252 at least partially shielding the first material portion 221. In one example, a small portion 234 of the second feature 220 is removed, however due to the small width 226 of full thickness portions 225, and the protective portions 252, a part of the second feature 220 remains protected.

In one example, a semiconductor structure including the second pattern of mask features 260 and the composite feature 262 are formed substantially concurrently. Forming a pattern of sub-resolution features, such as the second pattern of mask features 260 at the same time as a larger feature such as the composite feature 262 provides varied feature sizes, with a small number of processing steps. Fewer processing steps reduces complexity and cost of manufacturing.

Figure 2F:
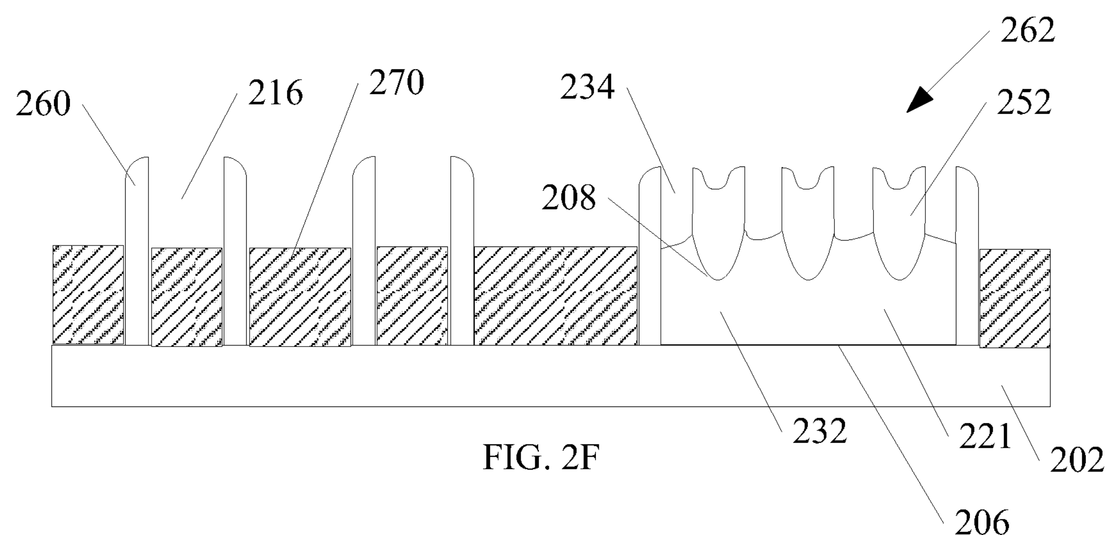

FIG. 2F illustrates a processing operation using a semiconductor structure such as a mask with the second pattern of mask features 260 and the composite feature 262 from FIG. 2E. In the example of FIG. 2F, a layer of material 270 is deposited, however the invention is not so limited. Other operations may include ion implanting, doping, etching, or other semiconductor processing operations using a mask.

Figure 2G:
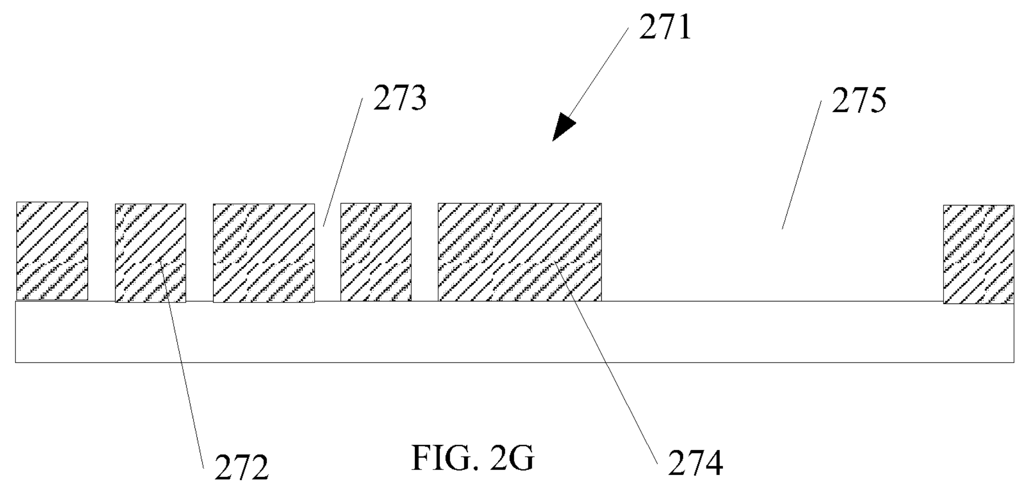

FIG. 2G illustrates an example of resulting features 271 from the process of FIG. 2F. In one example, the features 271 include linear features such as electrical transmission lines, for example, lines to interconnect memory cells in a memory device. A first number of features 272 in the resulting features 271 may include features separated by sub-resolution spaces 273, while other features 274 are larger that features 272, and separated by larger spaces 275.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of embodiments of the present invention. It is to be understood that the above description is intended to be illustrative and not restrictive. Combinations of the above embodiments, and other embodiments, will be apparent to those of skill in the art upon studying the above description.

What is claimed is:

1. A semiconductor structure, comprising:

a number of first masking structures formed from a first material, the number of first masking structures forming a direct interface with a substrate;

a composite masking structure, including:

a second material forming a direct interface with the substrate;

a protective portion including, side structures forming a direct interface with sides of the second material, the side structures formed from the first material, and one or more recesses in the second material, with the first material at least partially filing the one or more recesses.

2. The semiconductor structure of claim 1, wherein the first material includes a resist material.

3. The semiconductor structure of claim 1, wherein the second material includes a hardmask material.

4. The semiconductor structure of claim 3, wherein the hardmask material includes amorphous carbon.

5. A lithographic pattern on a semiconductor substrate, comprising:

a composite masking structure, including:

a first mask material forming a direct interface with the semiconductor substrate;

a number of recesses formed within the first mask material; and a second mask material different from the first mask material, formed over the first mask material, and within the number of recesses.

6. The lithographic pattern of claim 5, wherein the composite masking structure further includes end portions that form a direct interface with the semiconductor substrate and abut sides of the first mask material.

7. The lithographic pattern of claim 5, wherein the number of recesses are sub-lithographic.

8. The lithographic pattern of claim 5, wherein the first mask material is a resist material.

9. The lithographic pattern of claim 5, wherein the second mask material is a hardmask material.

10. The lithographic pattern of claim 9, wherein the hardmask includes amorphous carbon.

11. The lithographic pattern of claim 9, wherein the hardmask includes an oxide material.

12. The lithographic pattern of claim 5, further including a number of non-composite masking structures as part of the pattern.

13. A lithographic pattern on a semiconductor substrate, comprising:

a number of doubled lithographic features;

a composite masking structure, including:

a first mask material forming a direct interface with the semiconductor substrate;

a number of recesses formed within the first mask material; and a second mask material formed over the first mask material, and within the number of recesses.

14. The lithographic pattern of claim 13, wherein the number of doubled features are formed from the second mask material.

15. The lithographic pattern of claim 13, wherein the number of doubled features are formed from a hardmask material.

16. The lithographic pattern of claim 13, wherein both the doubled lithographic features and the number of recesses are sub-lithographic.

17. The lithographic pattern of claim 13, wherein the composite masking structure further includes end portions that form a direct interface with the semiconductor substrate and abut sides of the first mask material.

18. The lithographic pattern of claim 17, wherein the end portions are formed from the second mask material.

* * * * *